United States Patent
Han (10) Patent No.: US 10,056,033 B2
(45) Date of Patent: Aug. 21, 2018

(54) AMOLED PIXEL DRIVING CIRCUIT AND PIXEL DRIVING METHOD

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 243 days.

(21) Appl. No.: 15/105,565

(22) PCT Filed: Apr. 26, 2016

(86) PCT No.: PCT/CN2016/080187
§ 371 (c)(1),
(2) Date: Jun. 17, 2016

(87) PCT Pub. No.: WO2017/156828
PCT Pub. Date: Sep. 21, 2017

(65) Prior Publication Data
US 2018/0102090 A1   Apr. 12, 2018

(30) Foreign Application Priority Data
Mar. 17, 2016  (CN) .......................... 2016 1 0154542

(51) Int. Cl.
G09G 3/3233    (2016.01)
H01L 27/32     (2006.01)

(52) U.S. Cl.
CPC ....... *G09G 3/3233* (2013.01); *H01L 27/3262* (2013.01); *H01L 27/3265* (2013.01); *G09G 2320/045* (2013.01)

(58) Field of Classification Search
CPC ............ G09G 2320/045; G09G 3/3233; H01L 27/3262; H01L 27/3265
See application file for complete search history.

(56) References Cited

U.S. PATENT DOCUMENTS 9,875,688 B2 *  1/2018  Han ..................... G09G 3/3233
9,892,684 B2 *  2/2018  Han ....................... G09G 3/325
(Continued)

FOREIGN PATENT DOCUMENTS

CN          101359450 A      2/2009

*Primary Examiner* — Afroza Chowdhury
(74) *Attorney, Agent, or Firm* — Leong C. Lei (57) ABSTRACT

The present invention provides an AMOLED pixel driving circuit and a pixel driving method which utilize the 6T1C structure driving circuit, wherein the fourth thin film transistor (T4) is located between a gate (G) of the first thin film transistor (T1) and a power source negative voltage (VSS), and controls writing the power source negative voltage (VSS) to the gate (G) of the first thin film transistor (T1) by receiving an electrical property recovery control signal (CS), and the fifth thin film transistor (T5) and the sixth thin film transistor (T6) are electrically coupled to a drain (D) and a source (S) of the first thin film transistor (T1), respectively, and control writing a reference negative voltage (Vref) to the drain (D) and the source (S) of the first thin film transistor (T1) with the electrical property recovery control signal (CS).

11 Claims, 5 Drawing Sheets

(56) References Cited

U.S. PATENT DOCUMENTS

2009/0201231 A1* 8/2009 Takahara ............. G09G 3/3233
    345/76
2016/0063922 A1* 3/2016 Tsai .................... G09G 3/3233
    345/76

* cited by examiner

AMOLED PIXEL DRIVING CIRCUIT AND PIXEL DRIVING METHOD

FIELD OF THE INVENTION

The present invention relates to a display technology field, and more particularly to an AMOLED pixel driving circuit and a pixel driving method.

BACKGROUND OF THE INVENTION

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

The AMOLED is a current driving element. When the electrical current flows through the organic light emitting diode, the organic light emitting diode emits light, and the brightness is determined according to the current flowing through the organic light emitting diode itself. Most of the present Integrated Circuits (IC) only transmit voltage signals. Therefore, the AMOLED pixel driving circuit needs to accomplish the task of converting the voltage signals into the current signals. The traditional AMOLED pixel driving circuit generally is 2T1C, which is a structure comprising two thin film transistors and one capacitor to convert the voltage into the current.

Figure 1:
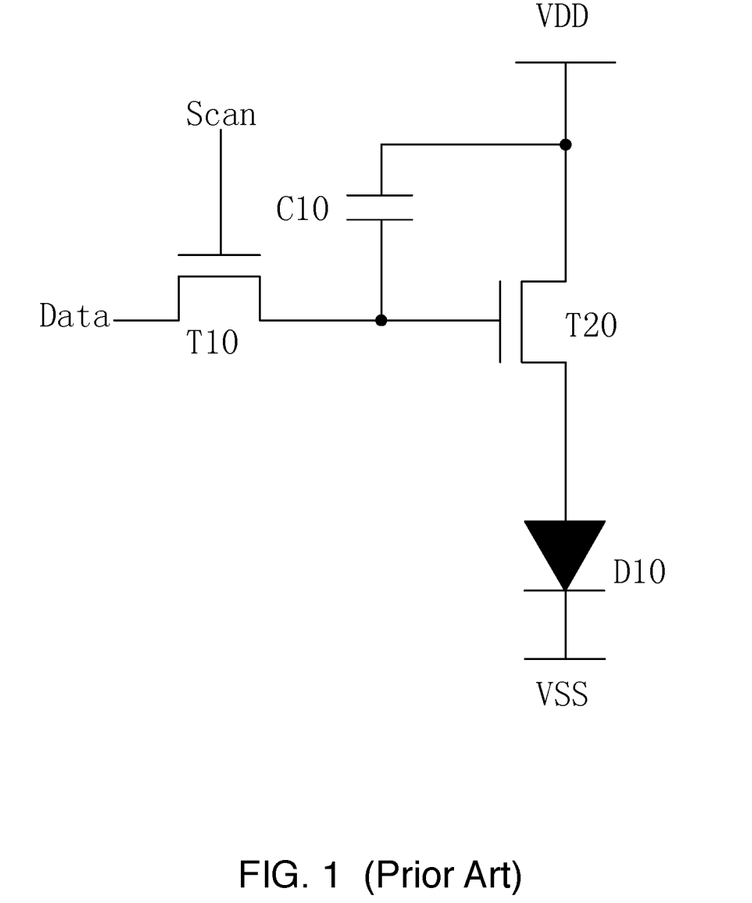
FIG. 1 is a circuit diagram of 2T1C pixel driving circuit employed for AMOLED according to prior art.

As shown in FIG. 1, which is a 2T1C pixel driving circuit employed for AMOLED, comprising a first thin film transistor T10, a second thin film transistor T20 and a capacitor C10. The first thin film transistor T10 is a switch thin film transistor, and the second thin film transistor T20 is a drive thin film transistor, and the capacitor C10 is a storage capacitor. Specifically, a gate of the first thin film transistor T10 receives a scan signal Scan, and a source receives a data signal Data, and a drain is electrically coupled to the gate of the second thin film transistor T20 and one end of the capacitor C10; a source of the second thin film transistor T20 is electrically coupled to a power source positive voltage VDD, and a drain is electrically coupled to an anode of the organic light emitting diode D10; a cathode of the organic light emitting diode D10 is electrically coupled to a power source negative voltage VSS; the one end of the capacitor C10 is electrically coupled to the drain of the first thin film transistor T10, and the other end is electrically coupled to the source of the second thin film transistor T20. As the AMOLED displays, the scan signal Scan controls the first thin film transistor T10 to be activated, and the data signal Data enters the gate of the second thin film transistor T20 and the capacitor C10 via the first thin film transistor T10. Then, the first thin film transistor T10 is deactivated. With the storage function of the capacitor C10, the gate voltage of the second thin film transistor T20 can remain to hold the data signal voltage to make the second thin film transistor T20 to be in the conducted state to drive the current to enter the organic light emitting diode D10 via the second thin film transistor T20 and to drive the organic light emitting diode D10 to emit light.

The structure of the pixel driving circuit shown in FIG. 1 is simpler and does not have the compensation function, and thus many defects exist. The more obvious one is: the driving thin film transistor, i.e. the second thin film transistor T20 is long term operating in the positive bias state, which leads to the threshold voltage shift and influences the display quality of the OLED display device.

SUMMARY OF THE INVENTION

An objective of the present invention is to provide an AMOLED pixel driving circuit, which can perform recovery to the electrical property drift of the drive thin film transistor to stable the light emitting brightness of the organic light emitting diode and promote the display quality.

Another objective of the present invention is to provide an AMOLED pixel driving method, which can perform recovery to the electrical property drift of the drive thin film transistor to stable the light emitting brightness of the organic light emitting diode and promote the display quality.

For realizing the aforesaid objectives, the present invention first provides an AMOLED pixel driving circuit, comprising: a first thin film transistor, a second thin film transistor, a third thin film transistor, a fourth thin film transistor, a fifth thin film transistor, a sixth thin film transistor, a capacitor, and an organic light emitting diode; the first thin film transistor is a drive thin film transistor, and the second thin film transistor is a switch thin film transistor;

the third thin film transistor is located between a drain of the first thin film transistor and a power source positive voltage, and controls a light emitting time of the organic light emitting diode by receiving a light emitting control signal;

the fourth thin film transistor is located between a gate of the first thin film transistor and a power source negative voltage, and controls writing the power source negative voltage to the gate of the first thin film transistor by receiving an electrical property recovery control signal;

the fifth thin film transistor and the sixth thin film transistor are electrically coupled to the drain and a source of the first thin film transistor, respectively, and control writing a reference negative voltage to the drain and the source of the first thin film transistor with the electrical property recovery control signal;

a difference value of the power source negative voltage and the reference negative voltage is negative, and a absolute value of the difference value of the power source negative voltage and the reference negative voltage does not exceed an activation voltage of the organic light emitting diode.

a gate of the second thin film transistor receives a scan signal, and a source receives a data signal, and a drain is electrically coupled to the gate of the first thin film transistor;

a gate of the third thin film transistor receives the light emitting control signal, and a source receives the power source positive voltage, and a drain is electrically coupled to the drain of the first thin film transistor;

a gate of the fourth thin film transistor receives the electrical property recovery control signal, and a source is electrically coupled to the gate of the first thin film transistor, and a drain receives the power source negative voltage;

a gate of the fifth thin film transistor receives the electrical property recovery control signal, and a source receives the reference negative voltage, and a drain is electrically coupled to the drain of the first thin film transistor;

a gate of the sixth thin film transistor receives the electrical property recovery control signal, and a source receives the reference negative voltage, and a drain is electrically coupled to the source of the first thin film transistor;

the gate of the first thin film transistor is electrically coupled to the drain of the second thin film transistor and the source of the fourth thin film transistor, and the source is electrically coupled to the anode of the organic light emitting diode and the drain of the sixth thin film transistor, and the drain is electrically coupled to the drain of the third thin film transistor and the drain of the fifth thin film transistor;

one end of the capacitor is electrically coupled to the gate of the first thin film transistor, and the other end is electrically coupled to the drain or the source of the first thin film transistor;

the anode of the organic light emitting diode is electrically coupled to the source of the first thin film transistor and the drain of the sixth thin film transistor, and a cathode receives the power source negative voltage.

All of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

Both the light emitting control signal and the electrical property recovery signal are provided by an external sequence controller.

The light emitting control signal, the scan signal and the electrical property recovery signal are combined with one another, and correspond to a program and light emitting stage, and an electrical property recovery stage one after another in one frame period;

in the program and light emitting stage, the scan signal is a high voltage level pulse, and the light emitting control signal is high voltage level, and the electrical property recovery signal is low voltage level;

in the electrical property recovery stage, the scan signal is low voltage level, and the light emitting control signal is low voltage level, and the electrical property recovery signal is high voltage level.

The present invention further provides an AMOLED pixel driving method, comprising steps of:

step 1, providing an AMOLED pixel driving circuit;

the AMOLED pixel driving circuit, comprising: a first thin film transistor, a second thin film transistor, a third thin film transistor, a fourth thin film transistor, a fifth thin film transistor, a sixth thin film transistor, a capacitor, and an organic light emitting diode; the first thin film transistor is a drive thin film transistor, and the second thin film transistor is a switch thin film transistor;

a gate of the second thin film transistor receives a scan signal, and a source receives a data signal, and a drain is electrically coupled to the gate of the first thin film transistor;

a gate of the third thin film transistor receives the light emitting control signal, and a source receives the power source positive voltage, and a drain is electrically coupled to the drain of the first thin film transistor;

a gate of the fourth thin film transistor receives the electrical property recovery control signal, and a source is electrically coupled to the gate of the first thin film transistor, and a drain receives the power source negative voltage;

a gate of the fifth thin film transistor receives the electrical property recovery control signal, and a source receives the reference negative voltage, and a drain is electrically coupled to the drain of the first thin film transistor;

a gate of the sixth thin film transistor receives the electrical property recovery control signal, and a source receives the reference negative voltage, and a drain is electrically coupled to the source of the first thin film transistor;

the gate of the first thin film transistor is electrically coupled to the drain of the second thin film transistor and the source of the fourth thin film transistor, and the source is electrically coupled to the anode of the organic light emitting diode and the drain of the sixth thin film transistor, and the drain is electrically coupled to the drain of the third thin film transistor and the drain of the fifth thin film transistor;

one end of the capacitor is electrically coupled to the gate of the first thin film transistor, and the other end is electrically coupled to the drain or the source of the first thin film transistor;

the anode of the organic light emitting diode is electrically coupled to the source of the first thin film transistor and the drain of the sixth thin film transistor, and a cathode receives the power source negative voltage;

step 2, entering a program and light emitting stage;

the electrical property recovery control signal provides low voltage level, and all the fourth thin film transistor, the fifth thin film transistor and the sixth thin film transistor are deactivated; the scan signal provides a high voltage level pulse signal row by row, and the second thin film transistor is activated, and the data signal of positive voltage level is written to the gate of the first thin film transistor, and the first thin film transistor is activated, and the light emitting control signal provides high voltage level, and the third thin film transistor is activated, and the organic light emitting diode emits light;

step 3, entering an electrical property recovery stage;

the scan signal provides low voltage level, and the second thin film transistor is deactivated, and the light emitting control signal provides low voltage level, and the third thin film transistor is deactivated; the electrical property recovery control signal provides high voltage level, and all the fourth thin film transistor, the fifth thin film transistor and the sixth thin film transistor are activated; the gate of the first thin film transistor is written with the power source negative voltage, and both the drain and the source of the first thin film transistor are written with the reference negative voltage; a difference value of the power source negative voltage and the reference negative voltage is negative, and a absolute value of the difference value of the power source negative voltage and the reference negative voltage does not exceed an activation voltage of the organic light emitting diode, and the organic light emitting diode does not emit light, and the power source negative voltage and the reference negative voltage performs electrical property recovery to the first thin film transistor.

All of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

Both the light emitting control signal and the electrical property recovery signal are provided by an external sequence controller.

The present invention further provides an AMOLED pixel driving circuit, comprising: a first thin film transistor, a second thin film transistor, a third thin film transistor, a fourth thin film transistor, a fifth thin film transistor, a sixth thin film transistor, a capacitor, and an organic light emitting diode; the first thin film transistor is a drive thin film transistor, and the second thin film transistor is a switch thin film transistor;

the third thin film transistor is located between a drain of the first thin film transistor and a power source positive voltage, and controls a light emitting time of the organic light emitting diode by receiving a light emitting control signal;

the fourth thin film transistor is located between a gate of the first thin film transistor and a power source negative voltage, and controls writing the power source negative voltage to the gate of the first thin film transistor by receiving an electrical property recovery control signal;

the fifth thin film transistor and the sixth thin film transistor are electrically coupled to the drain and a source of the first thin film transistor, respectively, and control writing a reference negative voltage to the drain and the source of the first thin film transistor with the electrical property recovery control signal;

a difference value of the power source negative voltage and the reference negative voltage is negative, and a absolute value of the difference value of the power source negative voltage and the reference negative voltage does not exceed an activation voltage of the organic light emitting diode;

wherein a gate of the second thin film transistor receives a scan signal, and a source receives a data signal, and a drain is electrically coupled to the gate of the first thin film transistor;

a gate of the third thin film transistor receives the light emitting control signal, and a source receives the power source positive voltage, and a drain is electrically coupled to the drain of the first thin film transistor;

a gate of the fourth thin film transistor receives the electrical property recovery control signal, and a source is electrically coupled to the gate of the first thin film transistor, and a drain receives the power source negative voltage;

a gate of the fifth thin film transistor receives the electrical property recovery control signal, and a source receives the reference negative voltage, and a drain is electrically coupled to the drain of the first thin film transistor;

a gate of the sixth thin film transistor receives the electrical property recovery control signal, and a source receives the reference negative voltage, and a drain is electrically coupled to the source of the first thin film transistor;

the gate of the first thin film transistor is electrically coupled to the drain of the second thin film transistor and the source of the fourth thin film transistor, and the source is electrically coupled to the anode of the organic light emitting diode and the drain of the sixth thin film transistor, and the drain is electrically coupled to the drain of the third thin film transistor and the drain of the fifth thin film transistor;

one end of the capacitor is electrically coupled to the gate of the first thin film transistor, and the other end is electrically coupled to the drain or the source of the first thin film transistor;

the anode of the organic light emitting diode is electrically coupled to the source of the first thin film transistor and the drain of the sixth thin film transistor, and a cathode receives the power source negative voltage;

wherein all of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

The benefits of the present invention are: the present invention provides an AMOLED pixel driving circuit and a pixel driving method which utilize the 6T1C structure driving circuit, wherein the third thin film transistor is located between a drain of the first thin film transistor and a power source positive voltage, and controls a light emitting time of the organic light emitting diode by receiving a light emitting control signal, and the fourth thin film transistor is located between a gate of the first thin film transistor and a power source negative voltage, and controls writing the power source negative voltage to the gate of the first thin film transistor by receiving an electrical property recovery control signal, and the fifth thin film transistor and the sixth thin film transistor are electrically coupled to the drain and a source of the first thin film transistor, respectively, and control writing a reference negative voltage to the drain and the source of the first thin film transistor with the electrical property recovery control signal, and a difference value of the power source negative voltage and the reference negative voltage is set to be negative, which can perform recovery to the electrical property drift of the drive thin film transistor after the organic light emitting diode finishes light emitting to stable the light emitting brightness of the organic light emitting diode and promote the display quality.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 2:
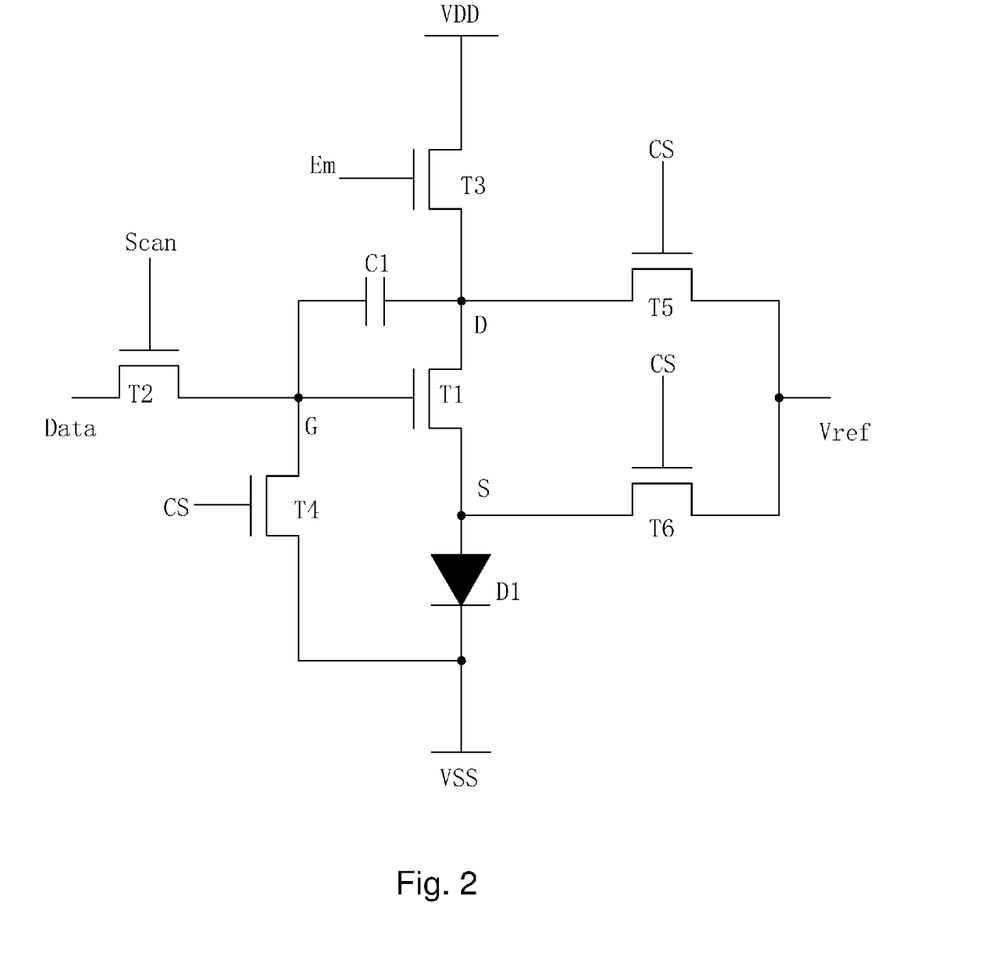
FIG. 2 is a circuit diagram of an AMOLED pixel driving circuit according to present invention.
Figure 3:
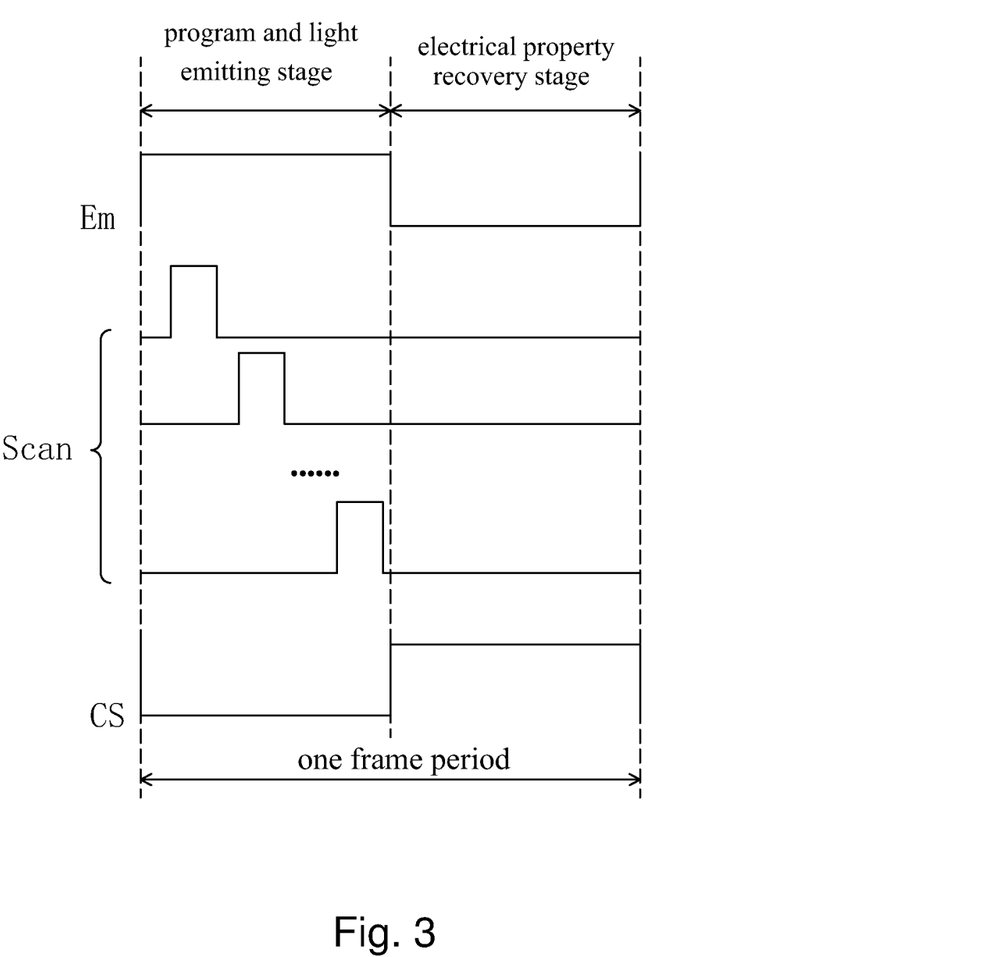
FIG. 3 is a sequence diagram of an AMOLED pixel driving circuit according to present invention.

Please refer to FIG. 2 and FIG. 3 at the same time. The present invention first provides an AMOLED pixel driving circuit, and the AMOLED pixel driving circuit utilizes a 6T1C structure, and comprises: a first thin film transistor T1, a second thin film transistor T2, a third thin film transistor T3, a fourth thin film transistor T4, a fifth thin film transistor T5, a sixth thin film transistor T6, a first capacitor C1 and an organic light emitting diode D1.

The second thin film transistor T2 is employed to be a switch thin film transistor, and a gate thereof receives a scan signal Scan, and a source receives a data signal Data, and a drain is electrically coupled to the gate G of the first thin film transistor T1; a gate of the third thin film transistor T3 receives the light emitting control signal Em, and a source receives the power source positive voltage VDD, and a drain is electrically coupled to the drain D of the first thin film transistor T1; a gate of the fourth thin film transistor T4 receives the electrical property recovery control signal CS, and a source is electrically coupled to the gate G of the first thin film transistor T1, and a drain receives the power source negative voltage VSS; a gate of the fifth thin film transistor T5 receives the electrical property recovery control signal CS, and a source receives the reference negative voltage Vref, and a drain is electrically coupled to the drain D of the first thin film transistor T1; a gate of the sixth thin film transistor T6 receives the electrical property recovery control signal CS, and a source receives the reference negative voltage Vref, and a drain is electrically coupled to the source S of the first thin film transistor T1; the first thin film transistor T1 is employed to be a drive thin film transistor, and a gate G thereof is electrically coupled to the drain of the second thin film transistor T2 and the source of the fourth thin film transistor T4, and the source S is electrically coupled to the anode of the organic light emitting diode D1 and the drain of the sixth thin film transistor T6, and the drain D is electrically coupled to the drain of the third thin film transistor T3 and the drain of the fifth thin film transistor T5; one end of the capacitor C1 is electrically coupled to the gate G of the first thin film transistor T1, and the other end is electrically coupled to the drain D or the source S of the first thin film transistor T1; the anode of the organic light emitting diode D1 is electrically coupled to the source S of the first thin film transistor T1 and the drain of the sixth thin film transistor T6, and a cathode receives the power source negative voltage VSS.

In comparison with the AMOLED pixel driving circuit of 2T1C structure according to prior art, in the AMOLED pixel driving circuit of the present invention, the third thin film transistor T3 is located between the drain D of the first thin film transistor T1 and the power source positive voltage VDD, and controls a light emitting time of the organic light emitting diode D1 by receiving a light emitting control signal Em; the fourth thin film transistor T4 is located between the gate G of the first thin film transistor T1 and the power source negative voltage VSS, and controls writing the power source negative voltage VSS to the gate G of the first thin film transistor T1 by receiving an electrical property recovery control signal CS; the fifth thin film transistor T5 and the sixth thin film transistor T6 are electrically coupled to the drain D and a source S of the first thin film transistor T1, respectively, and control writing a reference negative voltage Vref to the drain D and the source S of the first thin film transistor T1 with the electrical property recovery control signal CS, and a difference value of the power source negative voltage VSS and the reference negative voltage Vref is negative, and meanwhile, a absolute value of the difference value of the power source negative voltage VSS and the reference negative voltage Vref does not exceed an activation voltage of the organic light emitting diode D1. Thus, after the organic light emitting diode D1 finishes light emitting, the power source negative voltage VSS and the reference negative voltage Vref can be used to make the first thin film transistor T1, i.e. the drive thin film transistor be in the negative bias state, and thus to perform recovery to the electrical property drift of the drive thin film transistor to stable the light emitting brightness of the organic light emitting diode and promote the display quality.

Specifically, all of the first thin film transistor T1, the second thin film transistor T2, the third thin film transistor T3, the fourth thin film transistor T4, the fifth thin film transistor T5 and the sixth thin film transistor T6 are Low Temperature Poly-silicon thin film transistors, oxide semiconductor thin film transistors or amorphous silicon thin film transistors. Both the light emitting control signal Em and the electrical property recovery signal CS are provided by an external sequence controller.

With combination of FIG. 2 and FIG. 3, the light emitting control signal Em, the scan signal Scan and the electrical property recovery signal CS are combined with one another, and correspond to a program and light emitting stage, and an electrical property recovery stage one after another in one frame period.

In the program and light emitting stage, the scan signal Scan is a high voltage level pulse, and the light emitting control signal Em is high voltage level, and the electrical property recovery signal CS is low voltage level; all the fourth thin film transistor T4, the fifth thin film transistor T5 and the sixth thin film transistor T6 are deactivated; and the second thin film transistor T2 is activated, and the data signal Data of positive voltage level is written to the gate G of the first thin film transistor T1, and the first thin film transistor T1 is activated, and the third thin film transistor T3 is activated, and the organic light emitting diode D1 emits light. The high voltage level duration of the light emitting control signal Em can be adjusted, and thus to adjust the light emitting time of the organic light emitting diode D1. In the program and light emitting stage, the voltage level of the gate G of the first thin film transistor T1 is the positive voltage level of the data signal Data, and the power source positive voltage VDD makes both the voltage level of the drain D and the voltage level of the source S of the first thin film transistor T1 be positive voltage levels through the activated third thin film transistor T3, and the first thin film transistor T1, i.e. the drive thin film transistor is in the positive bias state.

In the electrical property recovery stage, the scan signal Scan is low voltage level, and the light emitting control signal Em is low voltage level, and the electrical property recovery signal CS is high voltage level; the second thin film transistor T2 is deactivated, and the third thin film transistor T3 is deactivated; all the fourth thin film transistor T4, the fifth thin film transistor T5 and the sixth thin film transistor T6 are activated; the gate G of the first thin film transistor T1 is written with the power source negative voltage VSS through the activated fourth thin film transistor T4, and the reference negative voltage Vref is written to the drain D and the source S of the first thin film transistor T1 respectively through the fifth thin film transistor T5 and the sixth thin film transistor T6 which are activated. Because a difference value of the power source negative voltage VSS and the reference negative voltage Vref is negative, and a absolute value of the difference value of the power source negative voltage VSS and the reference negative voltage Vref does not exceed an activation voltage of the organic light emitting diode D1, and in the electrical property recovery stage, the organic light emitting diode D1 does not emit light, and the power source negative voltage VSS and the reference negative voltage Vref make the first thin film transistor T1 be in the negative bias state, and thus to perform electrical property recovery to the first thin film transistor T1, i.e. the drive thin film transistor for preventing that the drive thin film transistor stays in the positive bias state in the long term to stable the light emitting brightness of the organic light emitting diode and promote the display quality.

On the basis of the same inventive idea, the present invention further provides an AMOLED pixel driving method, comprising steps of:

step 1, providing an AMOLED pixel driving circuit utilizing the 6T1C structure as shown in the aforesaid FIG. 2, and the description of the circuit is not repeated here.

step 2, entering a program and light emitting stage.

Figure 4:
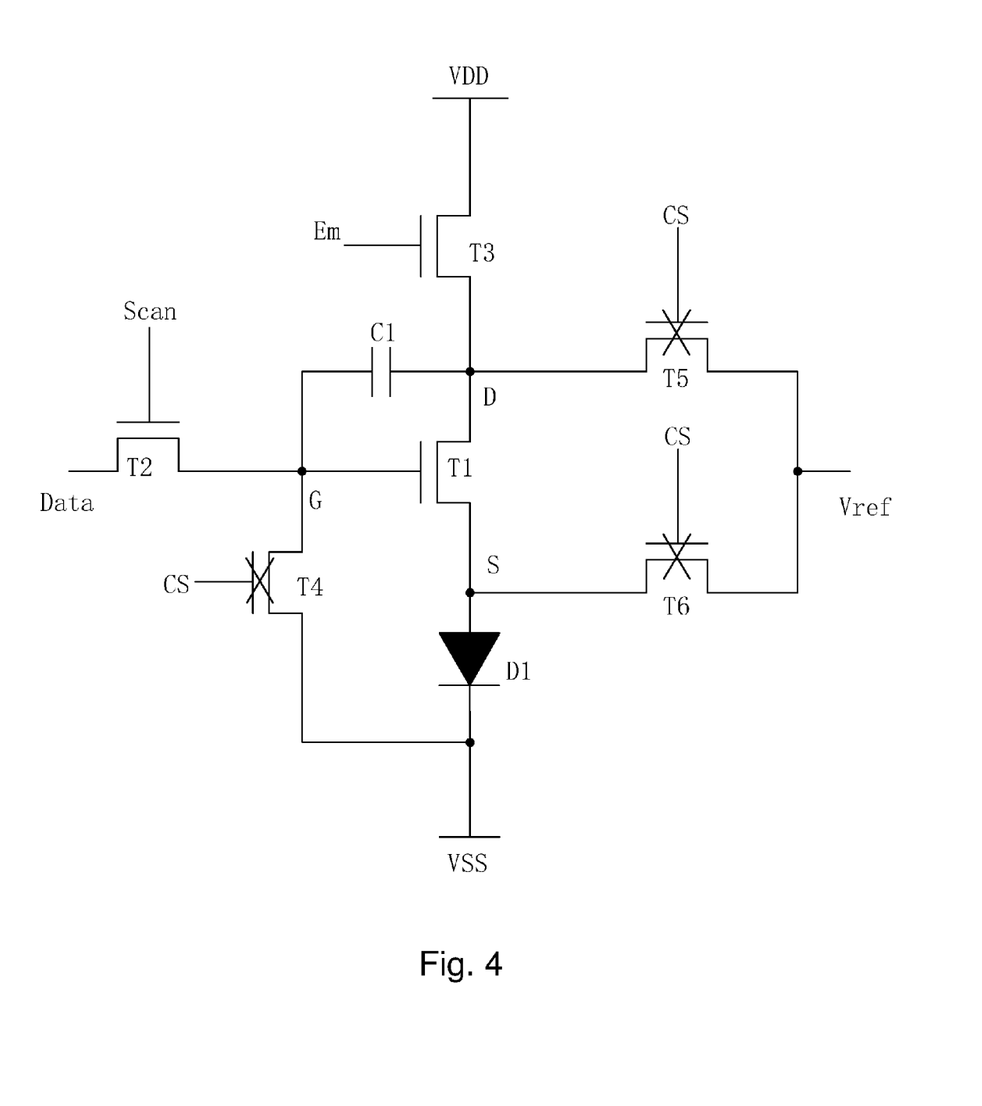
FIG. 4 is a diagram of the step 2 in an AMOLED pixel driving method according to the present invention.

With combination of FIG. 3 and FIG. 4, the electrical property recovery control signal CS provides low voltage level, and all the fourth thin film transistor T4, the fifth thin film transistor T5 and the sixth thin film transistor T6 are deactivated; the scan signal Scan provides a high voltage level pulse signal row by row, and the second thin film transistor T2 is activated, and the data signal Data of positive voltage level is written to the gate G of the first thin film transistor T1, and the first thin film transistor T1 is activated, and the light emitting control signal Em provides high voltage level, and the third thin film transistor T3 is activated, and the organic light emitting diode D1 emits light. The high voltage level duration of the light emitting control signal Em can be adjusted, and thus to adjust the light emitting time of the organic light emitting diode D1.

In the program and light emitting stage, the voltage level of the gate G of the first thin film transistor T1 is the positive voltage level of the data signal Data, and the power source positive voltage VDD makes both the voltage level of the drain D and the voltage level of the source S of the first thin film transistor T1 be positive voltage levels through the activated third thin film transistor T3, and the first thin film transistor T1, i.e. the drive thin film transistor is in the positive bias state.

step 3, entering an electrical property recovery stage.

Figure 5:
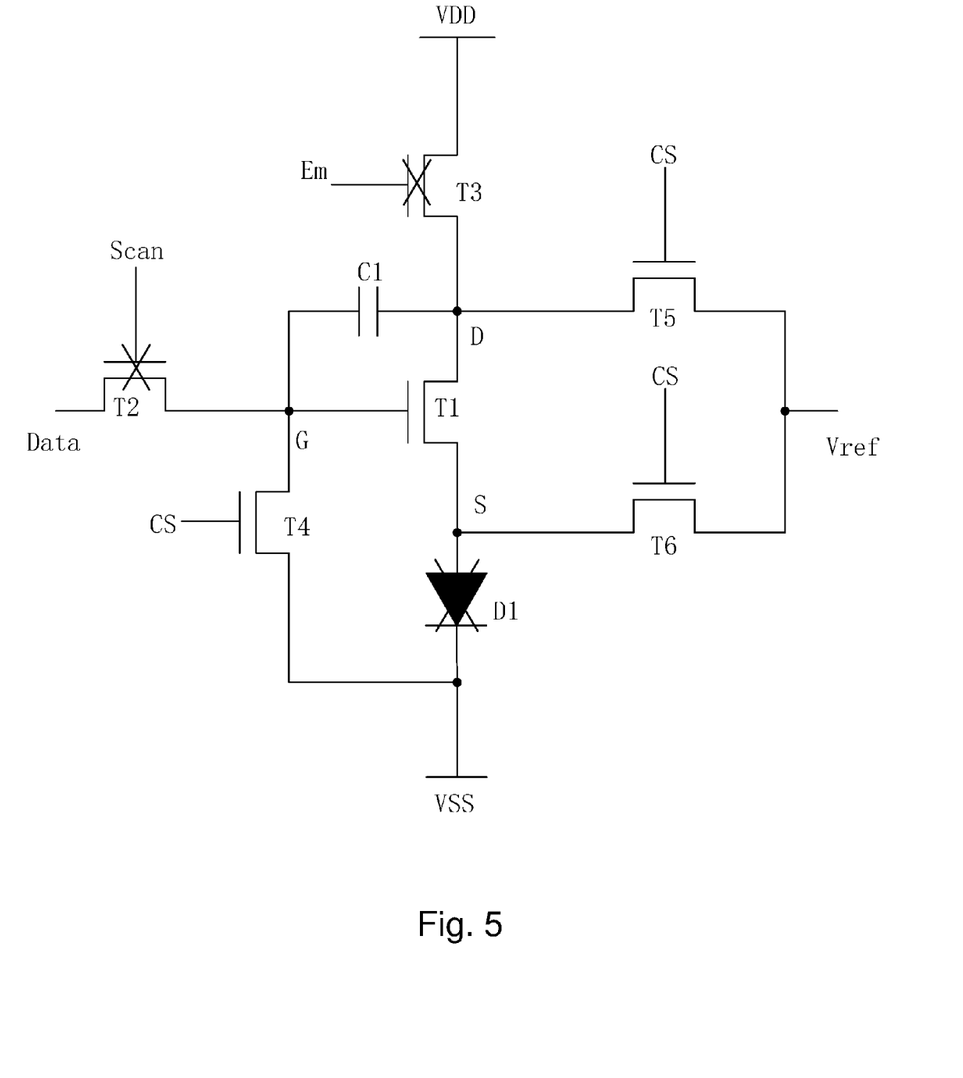
FIG. 5 is a diagram of the step 3 of an AMOLED pixel driving method according to the present invention.

With combination of FIG. 3 and FIG. 5, the scan signal Scan provides low voltage level, and the second thin film transistor T2 is deactivated, and the light emitting control signal Em provides low voltage level, and the third thin film transistor T3 is deactivated; the electrical property recovery control signal CS provides high voltage level, and all the fourth thin film transistor T4, the fifth thin film transistor T5 and the sixth thin film transistor T6 are activated; the gate G of the first thin film transistor T1 is written with the power source negative voltage VSS through the activated fourth thin film transistor T4, and the reference negative voltage Vref is written to the drain D and the source S of the first thin film transistor T1 respectively through the fifth thin film transistor T5 and the sixth thin film transistor T6 which are activated, and the organic light emitting diode D1 does not emit light.

In the electrical property recovery stage, the voltage level of the gate G of the first thin film transistor T1 is the power source negative voltage VSS, and voltage levels of the drain D and the source S are the reference negative voltage Vref. Because a difference value of the power source negative voltage VSS and the reference negative voltage Vref is negative, and a absolute value of the difference value of the power source negative voltage VSS and the reference negative voltage Vref does not exceed an activation voltage of the organic light emitting diode D1, and the power source negative voltage VSS and the reference negative voltage Vref make the first thin film transistor T1 be in the negative bias state, and thus to perform electrical property recovery to the first thin film transistor T1, i.e. the drive thin film transistor for preventing that the drive thin film transistor stays in the positive bias state in the long term to stable the light emitting brightness of the organic light emitting diode and promote the display quality.

In conclusion, the present invention provides an AMOLED pixel driving circuit and a pixel driving method which utilize the 6T1C structure driving circuit, wherein the third thin film transistor is located between a drain of the first thin film transistor and a power source positive voltage, and controls a light emitting time of the organic light emitting diode by receiving a light emitting control signal, and the fourth thin film transistor is located between a gate of the first thin film transistor and a power source negative voltage, and controls writing the power source negative voltage to the gate of the first thin film transistor by receiving an electrical property recovery control signal, and the fifth thin film transistor and the sixth thin film transistor are electrically coupled to the drain and a source of the first thin film transistor, respectively, and control writing a reference negative voltage to the drain and the source of the first thin film transistor with the electrical property recovery control signal, and a difference value of the power source negative voltage and the reference negative voltage is set to be negative, which can perform recovery to the electrical property drift of the drive thin film transistor after the organic light emitting diode finishes light emitting to stable the light emitting brightness of the organic light emitting diode and promote the display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An AMOLED pixel driving circuit, comprising: a first thin film transistor, a second thin film transistor, a third thin film transistor, a fourth thin film transistor, a fifth thin film transistor, a sixth thin film transistor, a capacitor, and an organic light emitting diode; the first thin film transistor is a drive thin film transistor, and the second thin film transistor is a switch thin film transistor;

the third thin film transistor is located between a drain of the first thin film transistor and a power source positive voltage, and controls a light emitting time of the organic light emitting diode by receiving a light emitting control signal;

the fourth thin film transistor is located between a gate of the first thin film transistor and a power source negative voltage, and controls writing the power source negative voltage to the gate of the first thin film transistor by receiving an electrical property recovery control signal;

the fifth thin film transistor and the sixth thin film transistor are electrically coupled to the drain and a source of the first thin film transistor, respectively, and control writing a reference negative voltage to the drain and the source of the first thin film transistor with the electrical property recovery control signal;

a difference value of the power source negative voltage and the reference negative voltage is negative, and a absolute value of the difference value of the power source negative voltage and the reference negative voltage does not exceed an activation voltage of the organic light emitting diode.

2. The AMOLED pixel driving circuit according to claim 1, wherein a gate of the second thin film transistor receives a scan signal, and a source receives a data signal, and a drain is electrically coupled to the gate of the first thin film transistor;

a gate of the third thin film transistor receives the light emitting control signal, and a source receives the power source positive voltage, and a drain is electrically coupled to the drain of the first thin film transistor;

a gate of the fourth thin film transistor receives the electrical property recovery control signal, and a source is electrically coupled to the gate of the first thin film transistor, and a drain receives the power source negative voltage;

a gate of the fifth thin film transistor receives the electrical property recovery control signal, and a source receives the reference negative voltage, and a drain is electrically coupled to the drain of the first thin film transistor;

a gate of the sixth thin film transistor receives the electrical property recovery control signal, and a source receives the reference negative voltage, and a drain is electrically coupled to the source of the first thin film transistor;

the gate of the first thin film transistor is electrically coupled to the drain of the second thin film transistor and the source of the fourth thin film transistor, and the source is electrically coupled to the anode of the organic light emitting diode and the drain of the sixth thin film transistor, and the drain is electrically coupled to the drain of the third thin film transistor and the drain of the fifth thin film transistor;

one end of the capacitor is electrically coupled to the gate of the first thin film transistor, and the other end is electrically coupled to the drain or the source of the first thin film transistor;

the anode of the organic light emitting diode is electrically coupled to the source of the first thin film transistor and the drain of the sixth thin film transistor, and a cathode receives the power source negative voltage.

3. The AMOLED pixel driving circuit according to claim 1, wherein all of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

4. The AMOLED pixel driving circuit according to claim 1, wherein both the light emitting control signal and the electrical property recovery control signal are provided by an external sequence controller.

5. The AMOLED pixel driving circuit according to claim 1, wherein the light emitting control signal, the scan signal and the electrical property recovery signal are combined with one another, and correspond to a program and light emitting stage, and an electrical property recovery stage one after another in one frame period;

in the program and light emitting stage, the scan signal is a high voltage level pulse, and the light emitting control signal is high voltage level, and the electrical property recovery signal is low voltage level;

in the electrical property recovery stage, the scan signal is low voltage level, and the light emitting control signal is low voltage level, and the electrical property recovery signal is high voltage level.

6. An AMOLED pixel driving method, comprising steps of:

step 1, providing an AMOLED pixel driving circuit;

the AMOLED pixel driving circuit, comprising: a first thin film transistor, a second thin film transistor, a third thin film transistor, a fourth thin film transistor, a fifth thin film transistor, a sixth thin film transistor, a capacitor, and an organic light emitting diode; the first thin film transistor is a drive thin film transistor, and the second thin film transistor is a switch thin film transistor;

a gate of the second thin film transistor receives a scan signal, and a source receives a data signal, and a drain is electrically coupled to the gate of the first thin film transistor;

a gate of the third thin film transistor receives the light emitting control signal, and a source receives the power source positive voltage, and a drain is electrically coupled to the drain of the first thin film transistor;

a gate of the fourth thin film transistor receives the electrical property recovery control signal, and a source is electrically coupled to the gate of the first thin film transistor, and a drain receives the power source negative voltage;

a gate of the fifth thin film transistor receives the electrical property recovery control signal, and a source receives the reference negative voltage, and a drain is electrically coupled to the drain of the first thin film transistor;

a gate of the sixth thin film transistor receives the electrical property recovery control signal, and a source receives the reference negative voltage, and a drain is electrically coupled to the source of the first thin film transistor;

the gate of the first thin film transistor is electrically coupled to the drain of the second thin film transistor and the source of the fourth thin film transistor, and the source is electrically coupled to the anode of the organic light emitting diode and the drain of the sixth thin film transistor, and the drain is electrically coupled to the drain of the third thin film transistor and the drain of the fifth thin film transistor;

one end of the capacitor is electrically coupled to the gate of the first thin film transistor, and the other end is electrically coupled to the drain or the source of the first thin film transistor;

the anode of the organic light emitting diode is electrically coupled to the source of the first thin film transistor and the drain of the sixth thin film transistor, and a cathode receives the power source negative voltage;

step 2, entering a program and light emitting stage;

the electrical property recovery control signal provides low voltage level, and all the fourth thin film transistor, the fifth thin film transistor and the sixth thin film transistor are deactivated; the scan signal provides a high voltage level pulse signal row by row, and the second thin film transistor is activated, and the data signal of positive voltage level is written to the gate of the first thin film transistor, and the first thin film transistor is activated, and the light emitting control signal provides high voltage level, and the third thin film transistor is activated, and the organic light emitting diode emits light;

step 3, entering an electrical property recovery stage;

the scan signal provides low voltage level, and the second thin film transistor is deactivated, and the light emitting control signal provides low voltage level, and the third thin film transistor is deactivated; the electrical property recovery control signal provides high voltage level, and all the fourth thin film transistor, the fifth thin film transistor and the sixth thin film transistor are activated; the gate of the first thin film transistor is written with the power source negative voltage, and both the drain and the source of the first thin film transistor are written with the reference negative voltage; a difference value of the power source negative voltage and the reference negative voltage is negative, and a absolute value of the difference value of the power source negative voltage and the reference negative voltage does not exceed an activation voltage of the organic light emitting diode, and the organic light emitting diode does not emit light, and the power source negative voltage and the reference negative voltage performs electrical property recovery to the first thin film transistor.

7. The AMOLED pixel driving method according to claim 6, wherein all of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

8. The AMOLED pixel driving method according to claim 6, wherein both the light emitting control signal and the electrical property recovery control signal are provided by an external sequence controller.

9. An AMOLED pixel driving circuit, comprising: a first thin film transistor, a second thin film transistor, a third thin film transistor, a fourth thin film transistor, a fifth thin film transistor, a sixth thin film transistor, a capacitor, and an organic light emitting diode; the first thin film transistor is a drive thin film transistor, and the second thin film transistor is a switch thin film transistor;
the third thin film transistor is located between a drain of the first thin film transistor and a power source positive voltage, and controls a light emitting time of the organic light emitting diode by receiving a light emitting control signal;
the fourth thin film transistor is located between a gate of the first thin film transistor and a power source negative voltage, and controls writing the power source negative voltage to the gate of the first thin film transistor by receiving an electrical property recovery control signal;
the fifth thin film transistor and the sixth thin film transistor are electrically coupled to the drain and a source of the first thin film transistor, respectively, and control writing a reference negative voltage to the drain and the source of the first thin film transistor with the electrical property recovery control signal;
a difference value of the power source negative voltage and the reference negative voltage is negative, and a absolute value of the difference value of the power source negative voltage and the reference negative voltage does not exceed an activation voltage of the organic light emitting diode;
wherein a gate of the second thin film transistor receives a scan signal, and a source receives a data signal, and a drain is electrically coupled to the gate of the first thin film transistor;
a gate of the third thin film transistor receives the light emitting control signal, and a source receives the power source positive voltage, and a drain is electrically coupled to the drain of the first thin film transistor;
a gate of the fourth thin film transistor receives the electrical property recovery control signal, and a source is electrically coupled to the gate of the first thin film transistor, and a drain receives the power source negative voltage;
a gate of the fifth thin film transistor receives the electrical property recovery control signal, and a source receives the reference negative voltage, and a drain is electrically coupled to the drain of the first thin film transistor;
a gate of the sixth thin film transistor receives the electrical property recovery control signal, and a source receives the reference negative voltage, and a drain is electrically coupled to the source of the first thin film transistor;
the gate of the first thin film transistor is electrically coupled to the drain of the second thin film transistor and the source of the fourth thin film transistor, and the source is electrically coupled to the anode of the organic light emitting diode and the drain of the sixth thin film transistor, and the drain is electrically coupled to the drain of the third thin film transistor and the drain of the fifth thin film transistor;
one end of the capacitor is electrically coupled to the gate of the first thin film transistor, and the other end is electrically coupled to the drain or the source of the first thin film transistor;
the anode of the organic light emitting diode is electrically coupled to the source of the first thin film transistor and the drain of the sixth thin film transistor, and a cathode receives the power source negative voltage;
wherein all of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

10. The AMOLED pixel driving circuit according to claim 9, wherein both the light emitting control signal and the electrical property recovery control signal are provided by an external sequence controller.

11. The AMOLED pixel driving circuit according to claim 9, wherein the light emitting control signal, the scan signal and the electrical property recovery signal are combined with one another, and correspond to a program and light emitting stage, and an electrical property recovery stage one after another in one frame period;
in the program and light emitting stage, the scan signal is a high voltage level pulse, and the light emitting control signal is high voltage level, and the electrical property recovery signal is low voltage level;
in the electrical property recovery stage, the scan signal is low voltage level, and the light emitting control signal is low voltage level, and the electrical property recovery signal is high voltage level.

* * * * *